US009510432B2

(12) United States Patent
Kempen et al.

(10) Patent No.: US 9,510,432 B2
(45) Date of Patent: Nov. 29, 2016

(54) RADIATION SOURCE AND LITHOGRAPHIC APPARATUS

(71) Applicant: ASML Netherlands B.V., Veldhoven (NL)

(72) Inventors: Antonius Theodorus Wilhelmus Kempen, Rosmalen (NL); Johan Frederik Dijksman, Weert (NL); Wilbert Jan Mestrom, Roermond (NL)

(73) Assignee: ASML Netherlands B.V., Veldhoven (NL)

( * ) Notice: Subject to any disclaimer, the term of this patent is extended or adjusted under 35 U.S.C. 154(b) by 163 days.

(21) Appl. No.: 14/383,359

(22) PCT Filed: Feb. 7, 2013

(86) PCT No.: PCT/EP2013/052420
§ 371 (c)(1),
(2) Date: Sep. 5, 2014

(87) PCT Pub. No.: WO2013/131706
PCT Pub. Date: Sep. 12, 2013

(65) Prior Publication Data
US 2015/0015863 A1 Jan. 15, 2015

Related U.S. Application Data

(60) Provisional application No. 61/607,745, filed on Mar. 7, 2012.

(51) Int. Cl.
*H05G 2/00* (2006.01)
*G03F 7/20* (2006.01)
*B05B 17/06* (2006.01)

(52) U.S. Cl.
CPC .......... *H05G 2/006* (2013.01); *B05B 17/0653* (2013.01); *G03F 7/709* (2013.01);
(Continued)

(58) Field of Classification Search
CPC .......... B05B 17/0653; B05B 17/0684; B05B 17/0607; G03F 7/70033; G03F 7/70058; G03F 7/7085; G03F 7/709; G03F 7/70916; H05G 2/006; H05G 2/005
See application file for complete search history.

(56) References Cited

U.S. PATENT DOCUMENTS 6,203,759 B1 * 3/2001 Pelc .................. B01L 3/0268
222/333
6,232,129 B1 5/2001 Wiktor
(Continued)

FOREIGN PATENT DOCUMENTS

CN 101652170 A 2/2010
EP 1 367 441 A2 12/2003
(Continued)

OTHER PUBLICATIONS

International Search Report directed to related International Patent Application No. PCT/EP2013/052420, mailed May 2. 2013; 5 pages.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

The present invention provides a method of monitoring the operation of a radiation source fuel droplet stream generator comprising a fuel-containing capillary and a piezo-electric actuator (500). The method comprises analyzing the resonance frequency spectrum of a system comprising the fuel-containing capillary and the piezo-electric actuator in particular to look for changes in the resonance frequencies of the acoustic system which may be indicative of a change in the properties of the system requiring investigation.

20 Claims, 4 Drawing Sheets

(52) U.S. Cl.
CPC ....... *G03F 7/70033* (2013.01); *G03F 7/70058* (2013.01); *G03F 7/7085* (2013.01); *G03F 7/70916* (2013.01)

(56) References Cited

U.S. PATENT DOCUMENTS

| | | | |
|---|---|---|---|
| 6,304,630 B1 * | 10/2001 | Bisschops | G03F 7/70033 378/119 |
| 6,375,299 B1 | 4/2002 | Foster et al. | |
| 8,689,459 B2 | 4/2014 | Poortinga et al. | |
| 2002/0129813 A1 | 9/2002 | Litherland et al. | |
| 2003/0024298 A1 | 2/2003 | Baber et al. | |
| 2004/0206179 A1 | 10/2004 | Kamiyama | |
| 2006/0279602 A1 | 12/2006 | Dijksman et al. | |
| 2007/0170377 A1 * | 7/2007 | Nakano | H05G 2/005 250/504 R |
| 2008/0003827 A1 | 1/2008 | Dijksman et al. | |
| 2009/0014668 A1 * | 1/2009 | Vaschenko | B82Y 10/00 250/504 R |
| 2009/0095821 A1 | 4/2009 | Feriani et al. | |
| 2010/0088067 A1 | 4/2010 | Jensen et al. | |
| 2010/0294953 A1 | 11/2010 | Vaschenko et al. | |
| 2012/0228526 A1 * | 9/2012 | Vaschenko | G03F 7/70033 250/504 R |

FOREIGN PATENT DOCUMENTS

| | | |
|---|---|---|
| EP | 2 154 574 A2 | 2/2010 |
| TW | 200742503 A | 11/2007 |
| TW | 200806485 A | 2/2008 |
| WO | WO 00/45955 A1 | 8/2000 |
| WO | WO 2004/096551 A1 | 11/2004 |
| WO | WO 2008/023300 A1 | 2/2008 |

OTHER PUBLICATIONS

International Searching Authority directed to related International Patent Application No. PCT/EP2013/052420, issued Sep. 9, 2014; 8 pages.

* cited by examiner

RADIATION SOURCE AND LITHOGRAPHIC APPARATUS

CROSS-REFERENCE TO RELATED APPLICATIONS

This application claims the benefit of U.S. provisional application 61/607,745, which was filed on Mar. 7, 2012, and which is incorporated herein in its entirety by reference.

FIELD

The present invention relates to a radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Another known method of producing EUV radiation is known as dual laser pulsing (DLP). In the DLP method droplets are pre-heated by a Nd:YAG laser to cause the droplet (eg a tin droplet) to decompose into vapour and small particles that are then heated to a very high temperature by a $CO_2$ laser.

In known methods such as LPP and DLP methods a stream of droplets must be generated. The droplets may be generated as either a continuous stream or in pulses.

For example, in one known method that is used in particular for LPP methods a heated container is filled with molten tin that passes from the container to a capillary via a filter and a piezoelectric actuator. A continuous jet issues from the end of the capillary that is modulated in velocity by the piezoelectric actuator. During flight this jet decomposes into small droplets and due to the modulated velocity these smaller droplets merge into larger droplets spaced at larger distances.

SUMMARY

According to the present invention there is provided a method of monitoring the operation of a radiation source fuel droplet stream generator comprising a fuel-containing capillary and a piezo-electric actuator attached to said capillary, the method comprising analysing the resonance frequency spectrum of a system comprising the fuel-containing capillary and the piezo-electric actuator.

In one embodiment of the invention the method comprises detecting changes in the resonance frequency spectrum. These changes in the spectrum may result from, for example, vibrations transmitted to the fuel droplet stream generator, at least partial blockage (eg clogging) of an outlet nozzle of the capillary, damage to the capillary (eg cracking of the capillary), or a change in the strength of the attachment of the actuator to the nozzle.

In another embodiment of the invention the method comprises sampling a signal in a drive circuit of the piezo-electric actuator. The signal may be sampled either on the drive side of the actuator or the common side of the actuator.

The resonance frequency spectrum may be analysed intermittently, e.g., on a scheduled basis or on demand, or may be analysed a continuous basis.

According to an aspect of the invention there is provided a radiation source fuel droplet stream generator comprising a capillary for containing fuel, a piezo-electric actuator surrounding and secured to said capillary, a circuit configured to drive said actuator, and an analyser configured to analyse the resonance frequency spectrum of a system comprising the fuel-containing capillary and the piezo-electric actuator.

Preferably, the analyser comprises a sampler configured to sample the signal in the drive circuit. The sampler may comprise a frequency response analyser, and the sampler may be located in a drive side of the drive circuit or may be located in a common side of said drive circuit.

According to another aspect of the present invention there is provided a lithographic apparatus comprising, a radiation source fuel droplet stream generator comprising a capillary for containing fuel, a piezo-electric actuator attached to said capillary, a circuit configured to drive said actuator, and an analyser configured to analyse the resonance frequency spectrum of a system comprising the fuel-containing capillary and the piezo-electric actuator, a radiation generator configured to generate radiation from a fuel droplet stream, and further comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

According to a still further aspect of the present invention there is provided a device manufacturing method comprising: generating a stream of fuel droplets by means of a fuel droplet generator comprising a capillary configured to contain fuel, a piezo-electric actuator attached to said capillary, a circuit configured to drive said actuator, and an analyser configured to analyse the resonance frequency spectrum of a system comprising the fuel-containing capillary and the piezo-electric actuator, generating radiation from said fuel droplet stream, and projecting a patterned beam of radiation through an opening in a projection system onto a substrate.

Further features and advantages as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
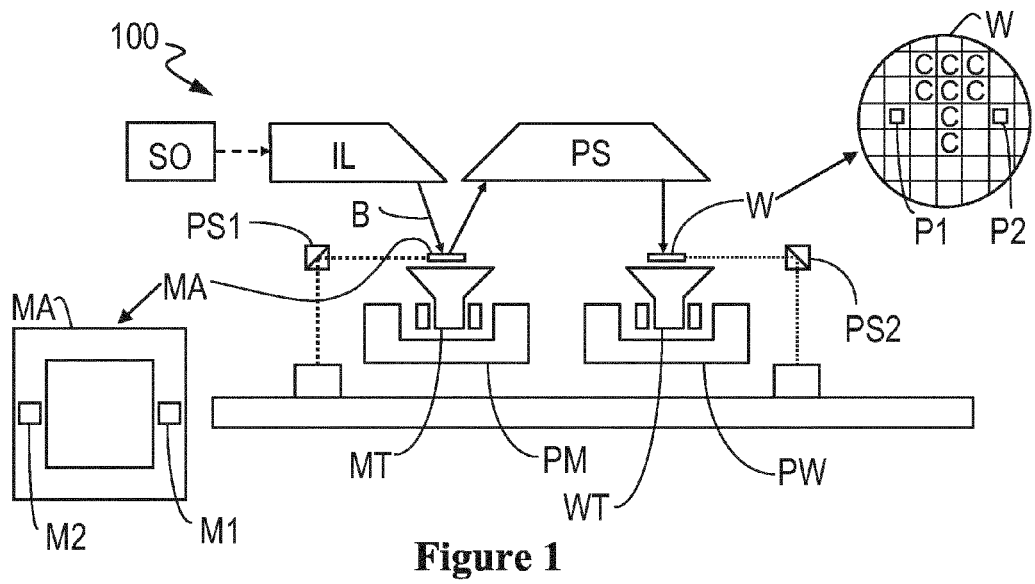
FIG. 1 schematically depicts a lithographic apparatus according to an embodiment of the invention.

Embodiments are described below with reference to the accompanying drawings. In the drawings, like reference numbers generally refer to identical or functionally similar elements. Additionally, the leftmost digit(s) of a reference number generally identifies the drawing in which the reference number first appears.

DETAILED DESCRIPTION

It is noted that reference in this specification to "one embodiment," "an embodiment," "an example embodiment," etc., indicate that the embodiment described may include a particular feature, structure, or characteristic, but not every embodiment may necessarily include the particular feature, structure, or characteristic. Moreover, such phrases are not necessarily referring to the same embodiment. Further, when a particular feature, structure, or characteristic, is described in connection with an embodiment, it is submitted that it is within the knowledge of one skilled in the art to effect such feature, structure, or characteristic, in connection with other embodiments whether or not explicitly described.

FIG. 1 schematically depicts a lithographic apparatus 100 according to an embodiment of the invention. The lithographic apparatus includes an EUV radiation source according to an embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet of material having the required line-emitting element, with a laser beam. The source collector module SO may be part of an EUV radiation source including a laser, not shown in FIG. 1, for providing the laser beam exciting the fuel. The resulting plasma emits output radiation, e.g., EUV radiation, which is collected using a radiation collector, disposed in the source collector module.

The laser and the source collector module may be separate entities, for example when a $CO_2$ laser is used to provide the laser beam for fuel excitation. In such cases, the radiation beam is passed from the laser to the source collector module with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensing system PS2 (e.g., using interferometric devices, linear encoders or capacitive sensors), the substrate table WT can be moved accurately, e.g., so as to position different target portions C in the path of the radiation beam B. Similarly, the first positioner PM and another position sensing system PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
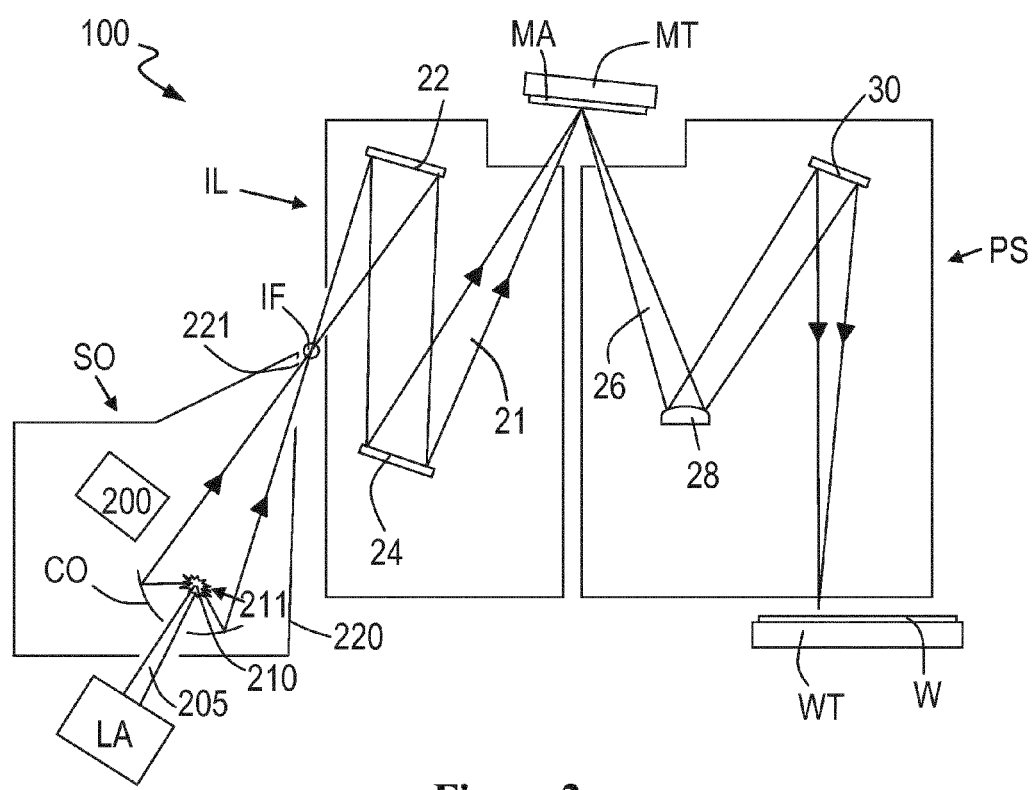
FIG. 2 is a more detailed view of the apparatus of FIG. 1.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module.

A laser LA is arranged to deposit laser energy via a laser beam 205 into a fuel, such as xenon (Xe), tin (Sn) or lithium (Li) which is provided from a fuel droplet stream generator 200. This creates a highly ionized plasma 210 at a plasma formation location 211 which has electron temperatures of several 10's of eV. The energetic radiation generated during de-excitation and recombination of these ions is emitted from the plasma, collected and focussed by a near normal incidence radiation collector CO. The laser LA and fuel droplet stream generator 200 may together be considered to comprise an EUV radiation source. The EUV radiation source may be referred to as a laser produced plasma (LPP) source.

A second laser (not shown) may be provided, the second laser being configured to preheat the fuel before the laser beam 205 is incident upon it. An LPP source which uses this approach may be referred to as a dual laser pulsing (DLP) source.

Radiation that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2. One feature of the source collector module SO which is worthy of note is that the laser source is angled which means that the stream of fuel droplets supplied to the laser source LA should be substantially horizontal to avoid fuel droplets striking the collector CO.

Figure 3:
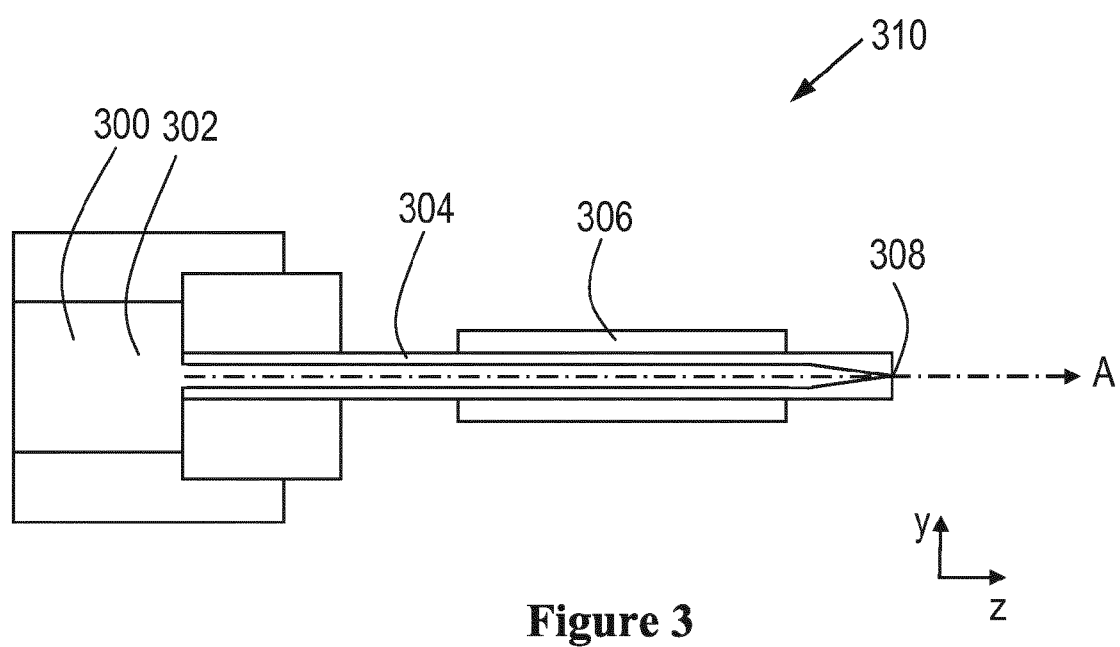
FIG. 3 schematically depicts a fuel droplet emitter which may form part of the lithographic apparatus shown in FIGS. 1 and 2.

FIG. 3 schematically shows a fuel droplet emitter 310 of the fuel droplet stream generator. The fuel droplet emitter 310 comprises a reservoir 300 which contains a fuel liquid 302 (for example liquid tin). The reservoir 300 is connected to a capillary 304 which is encircled by a piezo-electric actuator 306. A firm connection is provided between the piezo-electric actuator 306 and the capillary 304 (e.g., using a suitable bonding material such as a high temperature adhesive) such that vibrations may travel from the piezo-electric actuator to the capillary. The capillary 304 has one end open facing the reservoir 300 and at the other end is provided with a nozzle 308 from which fuel material is ejected in the direction of arrow A. Generally, a capillary or a capillary tube may be defined as a hollow elongated body that is used especially to convey fluids which has a cross-section that is sufficiently small in order for capillary action to play a significant role.

In an embodiment, the nozzle 308 may have a minimum inner diameter of 3-5 microns. The capillary 304 may for example be 25 millimeters long, with an inner diameter of 0.7 millimeter and a wall thickness of 0.15 millimeters. The piezo-electric actuator 306 may for example be around 10 mm long, and may be fixed to the capillary 304 using a high temperature adhesive, i.e., one which does not loose adhesion at the operating temperature of the fuel supply 300. It will of course be understood that these dimensions are exemplary only. The adhesive layer should be as thin as possible in order to ensure good mechanical coupling between the piezo-actuator and the capillary, and possibly the adhesive may contain ceramic particles to increase its glass temperature and improve acoustic transmission. The piezo-electric actuator 306 with its drive electronics (not shown) is configured such that it may squeeze the capillary 304 with a desired modulation frequency, thereby modulating the pressure within the capillary with the effect that the speed of the stream may be varied in a manner that will be described in more detail below.

Figure 4:
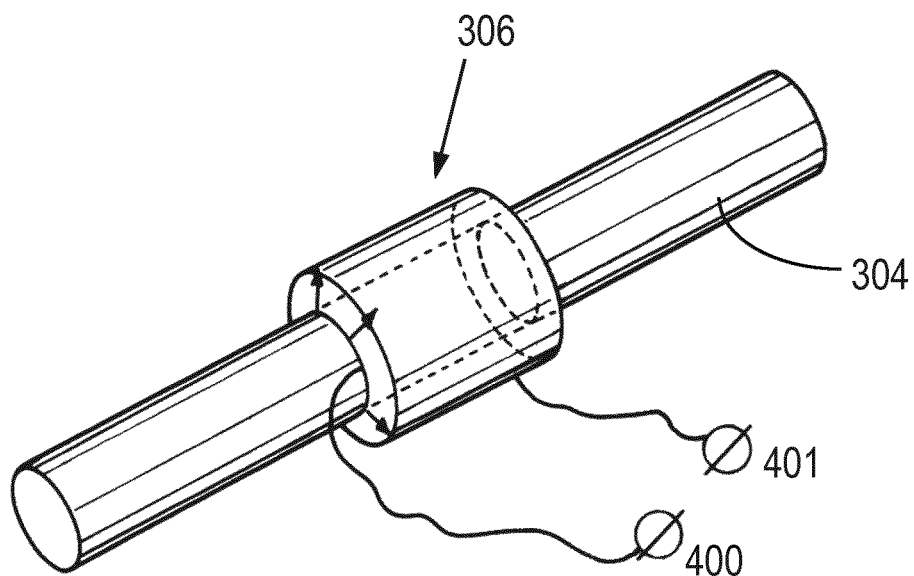
FIG. 4 shows schematically in more detail the piezo-electric material surrounding the capillary.

FIG. 4 shows in more detail the piezo-actuator 306 surrounding the glass capillary 304. The piezo-actuator 306 is configured as a tube of piezo-electric ceramic material. The inner surface of the ceramic tube is provided with one electrode 400 and the outer surface of the ceramic tube is provided with another electrode 401. When a modulating signal is applied to these electrodes the ceramic tube will contract and expand radially thus exerting a radial pressure on the capillary and the fuel within the capillary.

In use, the liquid fuel 302 is held at pressure inside the reservoir 300. This may be achieved for example by pressuring gas (not shown) which is also located in the reservoir 300, such that pressure is applied to the liquid fuel by the gas. As a result of the pressure a stream of fuel issues from the nozzle 308. In the absence of the piezo-electric actuator 306 the stream would naturally break-up after travelling a distance from the nozzle 308 (the distance being for example 100-1000 times the diameter of the nozzle), thereby forming a stream of droplets. This is referred to as Rayleigh break-up. When Rayleigh break-up occurs, fuel droplets are formed with a diameter which is around twice the diameter of the nozzle 308 or slightly less than this, and with a separation around 4.5 times the diameter of the nozzle. Although Rayleigh break-up of the stream of fuel liquid will occur without actuation of the piezo-electric actuator 306, the piezo-electric actuator 306 may be used to control the Rayleigh break-up by modulating the pressure inside the capillary 304. By modulating the pressure inside the capillary, the exit velocity of the fuel from the nozzle is modulated and the stream breaks up in a controlled manner directly after leaving the nozzle. At frequencies around the Rayleigh break-up frequency since droplets are formed spaced at a distance controlled by the mean exit velocity and the applied frequency. At frequencies much lower than the Rayleigh frequency single small droplets are formed in clouds of alternating high speed droplets and low speed droplets, relative to the mean jet velocity. The high speed droplets overtake the low speed droplets and at some distance from the nozzle merge into large droplets spaced by a correspondingly large inter-droplet distance.

The current design has a number of problems. The distance between the droplets has to be as large as possible, with the given volume and velocity needed, this leads to the coalescence of many very small droplets. To guide the thinking the following estimate. To end up with droplets with a diameter of 20 micron (volume 4.19 pl), velocity 100 m/s, rate 100 kHz spaced at 1 mm, the volume rate of flow Q has to be:

$$Q = \text{droplet volume} * \text{frequency} = 4.19 \text{ pl} * 100 \text{ kHz} = 4.19 * 10^{-10} \text{ m}^3/\text{s}$$

This volume rate of flow has to be forced through a nozzle (radius r) with the prescribed droplet velocity:

$$\pi r^2 = Q/\text{velocity}$$

From which equation it follows that r=1.155 micron (diameter 2.31 micron, basic droplet size 44 fl). This value is extremely small and makes the system very prone to any contamination present. The nozzle is actually the final sieve for any particle flowing around in the tin bath. Although 1 mm droplet distance is currently specified for proper operation of the source, an even larger distance is preferable. This means smaller nozzles, because the only parameter that leads to larger inter-droplet spacing is the velocity. In order to make the large droplets out of clouds of smaller ones requires the coalescence of about 100 small droplets and any disturbance of the droplet stream (e.g., coming from the gas flows inside the vacuum chamber to avoid contamination of the mirror and other parts in the optical path) may disturb the coalescence process. A major concern relates to the effect of the piezo-actuator on the modulation of the jet. The smaller this effect the longer the coalescence process takes, and the longer the distance measured from the nozzle needed for full coalescence.

The drive frequency that is used for droplet formation, about 100 kHz, is far lower than the natural frequency of the Rayleigh break-up. This means that in order to facilitate break-up closer to the nozzle higher frequencies must be generated and this may be done by applying a block pulse to the piezo-actuator rather than a sinusoidal signal. The block pulse will contain overtones with decreasing amplitude at higher frequencies but the extent to which these high-frequency components reach the capillary and influence droplet formation will depend on a number of factors including the physical characteristics of the capillary, the fuel within the reservoir and capillary, and the bonding of the piezo-actuator to the capillary.

It will therefore be understood that the physical characteristics of the capillary/piezo-actuator system (including the fuel within the capillary) are critical to the proper functioning of the droplet generator and there are a number of possible problems that can deleteriously affect the performance of the droplet generator such as, for example, clogging of the capillary and/or nozzle by a contaminant, cracking or other physical damage to the capillary, and a weakening of the bond between the capillary and the piezo-actuator. Faults in the performance of the power and control electronics that drive the piezo-actuator will also have an affect on droplet formation. It will also be appreciated that the fuel droplet emitter is located within the lithographic apparatus in a high vacuum and therefore cannot easily be inspected once it is in place.

In embodiments of the invention the performance of the droplet generator may be remotely monitored by sampling the signal and analysing the frequency spectrum of the system comprising the piezo-actuator, the capillary and the fuel within the capillary.

Figure 5A:
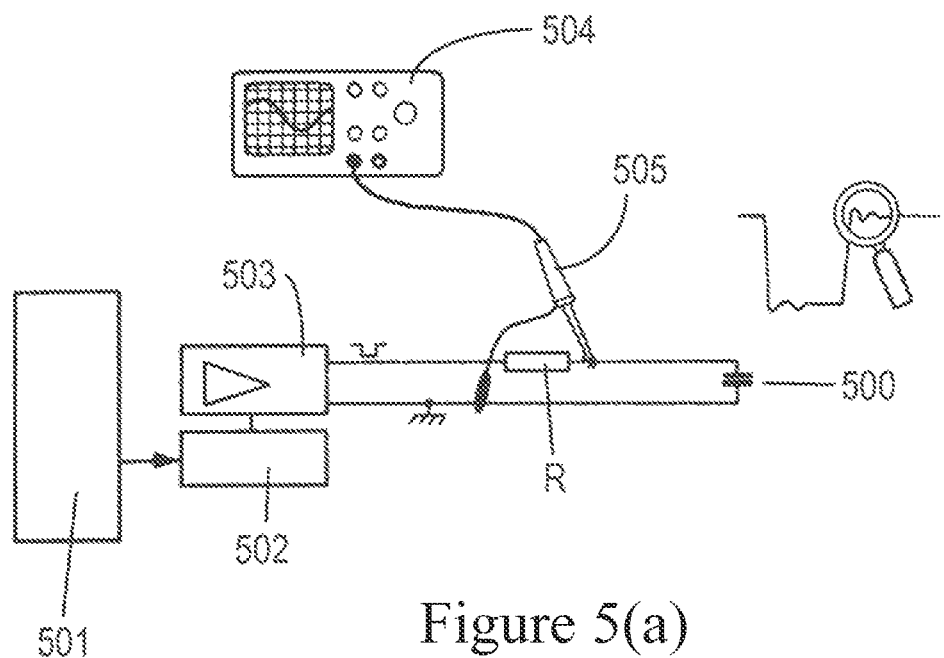
FIGS. 5(a) and 5(b) schematically depicts (a) a first method of obtaining frequency response information, and (b) a second method of obtaining frequency response information, respectively.

FIG. 5(a) shows a first embodiment of how this may be done. FIG. 5(a) shows schematically the piezo-actuator 500 and controller 501 for the piezo-actuator. Controller 501 provides an output to pulse amplifier voltage source 502, which in turn sends a signal to pulse amplifier 503 in order to generate a pulse to drive the piezo-actuator 500. In this embodiment, a frequency response analyser 504 is used, which in this embodiment, samples the signal across the piezo-actuator 500 using a voltage probe 505. An example of the signal is shown in the upper right corner of FIG. 5(a). The basic shape of the signal will be the pulse as applied by the controller 501, voltage source 502 and pulse amplifier 503, but the shape of the pulse will be modified by the resonant characteristics of the system comprising the piezo-actuator, the capillary and the fuel within the capillary. This can be seen represented by the fluctuations in the signal when it switches between high and low conditions.

Figure 5B:
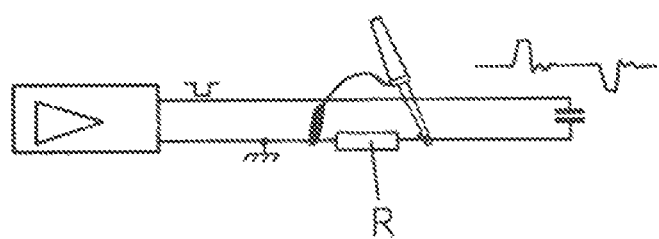

FIG. 5(b) shows an alternative embodiment in which the signal is detected after being applied to the piezo-actuator by measuring the voltage across a resistor R located between the piezo-actuator and ground. The embodiment of FIG. 5(a) does allow the shape of the pulse to be studied but the downside of this is that because the pulse has a much greater magnitude than the variations introduced by the resonance of the system, it can be hard to identify those resonance peaks and amplification of the signal is not possible. In contrast, in the embodiment of FIG. 5(b) the pulse has been removed (as shown in the schematic signal plot in the upper right of FIG. 5(b)) which allows the sampled signal to be amplified so that more detail and information can be extracted.

In FIGS. 5(a) and 5(b) there are shown schematic analogue plots of the sampled signal and in principle such an analogue plot could be displayed, but in practice it will be more useful to analyse the shape of the pulse using a digital signal analyser which is capable of determining the components within the signal and accurately measuring resonance peaks. Data obtained in this way may be stored in a computer and may be compared by the computer with past historical data or with expected data for that fuel droplet generator in order to determine when there has been a change in the resonance frequencies of the system. In some embodiments the computer may be configured to issue an alarm when there has been a change in the resonance frequency beyond a predetermined extent. The computer may also be configured to change the operating conditions of the piezo-electric actuator, e.g., by changing the applied pulse, to correct for any such changes.

It will be understood that in either embodiment the signal can be sampled and analysed either continuously, or on a regular scheduled basis, or simply on demand when required.

It should be noted that in view of the complexity of the acoustic system comprising the piezo-actuator, the capillary and fuel within the capillary, little useful information may be obtained from examining a single frequency spectrum. What will be of greater practical use is to look for changes in the spectrum as any such change will be an indication that something has happened to the system that may require investigation. For example, a crack in the capillary may reduce the effective length (in acoustic terms) of the capillary which would have the effect of increasing resonant frequencies. The following is an example of how a change to the system (in this case a small clogging of the capillary) can be detected as a change in a resonant frequency.

The fluid in the capillary can be considered as a quarter-wavelength resonator. The fundamental frequency and the overtones are given by:

$$f_{\lambda/4} \approx \frac{c}{4L}, f_{n,\lambda/4} \approx (2n-1)\frac{c}{4L}, n >= 1$$

Where c is the speed of sound in the fluid corrected for the flexibility of the capillary, and L is the length of the fluid column in the capillary. These expressions are approximate because there is a weak dependency on the size of the nozzle but that can be disregarded for the present consideration. For a droplet generator of the type shown in FIG. 3 with a speed of sound of 1500 m/s (the speed of sound in Sn is 2500 m/s but is reduced because of the flexibility of the capillary) and a capillary 25 mm long the fundamental will be at 15 kHz and the first overtone at 45 kHz.

The effect of clogging can be estimated as follows. Consider a pipe of length L and cross-section A with one end open and the other end almost closed by a hole of length $L_1$ and cross-section $A_1$. It will be understood that this is analogous to the capillary with a nozzle. In order to find the resonant frequencies it is necessary to consider solutions of the wave equation that are subject to the given boundary conditions:

$$\frac{1}{c^2}\frac{\partial^2 p}{\partial t^2} - \frac{\partial^2 p}{\partial z^2} = 0, z = 0: p = 0, z = L: p = \rho L_1 \frac{A}{A_1}\frac{\partial^2 Z}{\partial t^2}$$

Where p denotes the excess pressure with respect to ambient, z the co-ordinate along the axis of the pipe, t time, c the corrected velocity of sound, and ρ the density. This leads to the characteristic equation;

$$\tan\frac{\omega L}{c} = -\frac{L_1}{L}\frac{A}{A_1}\frac{\omega L}{c}$$

Only when $\omega$ is a root of this transcendental equation are non-zero solutions of the wave equation found. In case the cross-section equals zero the quarter-wavelength solution is retrieved. When the cross-section is very small;

$$\frac{\omega L}{c} = \frac{\pi}{2} + \varepsilon, \varepsilon \ll 1, \varepsilon \approx \frac{2}{\pi}\frac{L}{L_1}\frac{A_1}{A}, \frac{\omega L}{c} = \frac{\pi}{2}\left(1 + \frac{4}{\pi^2}\frac{L}{L_1}\frac{A_1}{A}\right)$$

As an example consider a nozzle with a length of 0.1 mm and radius of 2 microns attached to a pipe of length 25 mm and 0.5 mm inner radius. Then the relative change with respect to the quarter $\lambda$ solution is 0.162%. As calculated above the keynote frequency equals 15 kHz, so the frequency change is 24 Hz upwards. Suppose the nozzle has been clogged by just 0.1 of a micron along its inner surface, the deviation from the standard solution equals 0.146%, being 22 Hz. The difference in resonance frequencies between the slightly clogged and non-clogged situation measures 2 Hz, a value easily detectable. This is the more so because at low frequencies the acoustic system is hardly damped (molten tin has a low viscosity 1.8 mPas).

It will be understood that at least in its preferred forms the present invention is capable of detecting changes in the acoustic properties of the system that may result from a number of causes including for example clogging of the nozzle, cracking of the capillary or any change in the nature of the clamping of the piezo-electric actuator to the capillary (for example because of the a degradation in the properties of the adhesive). The invention may also be able to detect vibrations in the system originating from vibrations in other parts of the lithographic apparatus and which may adversely affect performance of the droplet generator.

It will be understood that it may not be immediately obvious from a change in the resonant frequencies of the system what has happened, i.e., whether there is clogging of the nozzle, a crack in the capillary or some other event, but it will be clear that something has happened that should be investigated and that the droplet generator should be checked. In time and over a period of use experimental evidence and experience may indicate that a particular type of shift in the resonant frequencies is indicative of a particular type of problem. The sampling of the signal to analyse the resonant frequencies may be done on an occasional or scheduled basis, or it may be done on a continuous basis in which case an alarm may be generated if any of the resonant frequencies deviate by more than a predetermined amount.

Embodiments of the invention may also be used to confirm that a new droplet generator is working properly when it is installed by comparing the frequency spectrum with the expected frequency spectrum.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LED's, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of monitoring operation of a radiation source fuel droplet stream generator comprising a capillary and a piezo-electric actuator that are coupled to each other, the method comprising:
    using the capillary to contain a fuel; and
    analyzing a resonance frequency spectrum of the coupled capillary and piezo-electric actuator during the operation of the radiation source fuel droplet stream generator using the coupled capillary and piezo-electric actuator.

2. The method of claim 1, further comprising detecting a change in the resonance frequency spectrum corresponding to a change in a property of the coupled capillary and piezo-electric actuator.

3. The method of claim 1, further comprising detecting a change in a property of the coupled capillary and piezo-electric actuator, based on the analyzed resonance frequency spectrum, corresponding to vibrations of the radiation source fuel droplet stream generator.

4. The method of claim 1, further comprising detecting a change in a property of the coupled capillary and piezo-electric actuator, based on the analyzed resonance frequency spectrum, corresponding to at least partial blockage of an outlet nozzle of the capillary.

5. The method of claim 1, further comprising detecting a change in a property of the coupled capillary and piezo-electric actuator, based on the analyzed resonance frequency spectrum, corresponding to a damage to the capillary.

6. The method of claim 1, further comprising detecting a change in a property of the coupled capillary and piezo-electric actuator, based on the analyzed resonance frequency spectrum, corresponding to a change in coupling strength between the piezo-electric actuator and the capillary.

7. The method of claim 1, further comprising sampling a signal in a drive circuit of the piezo-electric actuator during the operation of the radiation source fuel droplet stream generator.

8. The method of claim 7, wherein the signal is sampled on a drive side of the drive circuit.

9. The method of claim 7, wherein the signal is sampled on a common side of the drive circuit.

10. The method of claim 1, further comprising analyzing the resonance frequency spectrum intermittently.

11. The method of claim 1, further comprising analyzing the resonance frequency spectrum continuously.

12. A radiation source fuel droplet stream generator comprising:

a capillary configured to contain fuel;
a piezo-electric actuator coupled to the capillary;
a drive circuit configured to drive the piezo-electric actuator; and
an analyzer configured to analyze a resonance frequency spectrum of the coupled capillary and piezo-electric actuator during the operation of the radiation source fuel droplet stream generator using the coupled capillary and piezo-electric actuator.

13. The radiation source fuel droplet stream generator of claim 12, wherein the analyzer is further configured to sample a signal in the drive circuit.

14. The radiation source fuel droplet stream generator of claim 12, wherein the analyzer comprises a frequency response analyzer.

15. The radiation source fuel droplet stream generator of claim 12, wherein the analyzer is located on a drive side of the drive circuit.

16. The radiation source fuel droplet stream generator of claim 12, wherein the analyzer is located on a common side of the drive circuit.

17. A lithographic projection apparatus comprising:
a radiation generator configured to generate radiation from a fuel droplet stream, the radiation generator comprising:
a capillary configured to contain fuel,
a piezo-electric actuator coupled to the capillary,
a circuit configured to drive the piezo-electric actuator, and
an analyzer configured to analyze a resonance frequency spectrum of the coupled capillary and piezo-electric actuator during the operation of the radiation generator using the coupled capillary and piezo-electric actuator;
an optical element configured to focus the radiation into a radiation beam;
an illumination system configured to condition the radiation beam;
a support configured to support a patterning device, the patterning device being capable of imparting the radiation beam with a pattern in its cross-section to form a patterned radiation beam;
a substrate table configured to hold a substrate; and
a projection system configured to project the patterned radiation beam onto a target portion of the substrate.

18. The lithographic projection apparatus of claim 17, further comprising detecting a change in a property of the coupled capillary and piezo-electric actuator, based on the analyzed resonance frequency spectrum, corresponding to at least one of:
vibrations of the fuel droplet generator;
at least partial blockage of an outlet nozzle of the capillary;
a damage to the capillary; and
a change in coupling strength between the piezo-electric actuator and the capillary.

19. A device manufacturing method comprising:
generating a stream of fuel droplets using a fuel droplet generator having a capillary and a piezo-electric actuator that are coupled to each other;
using the capillary to contain fuel;
driving, using a circuit, the piezo-electric actuator;
analyzing a resonance frequency spectrum of a system the coupled capillary and piezo-electric actuator during operation of the fuel droplet generator using the coupled capillary and piezo-electric actuator;
generating radiation from the stream of fuel droplet; and
projecting a patterned beam of radiation through an opening in a projection system onto a substrate.

20. The device manufacturing method of claim 19, further comprising sampling a signal in the circuit during the operation of the fuel droplet generator.

* * * * *

UNITED STATES PATENT AND TRADEMARK OFFICE
CERTIFICATE OF CORRECTION

PATENT NO.        : 9,510,432 B2
APPLICATION NO.   : 14/383359
DATED             : November 29, 2016
INVENTOR(S)       : Kempen et al.

It is certified that error appears in the above-identified patent and that said Letters Patent is hereby corrected as shown below:

In Claim 19, Column 14, Line 27, please delete "a system".

Signed and Sealed this
Eighth Day of May, 2018

Andrei Iancu
*Director of the United States Patent and Trademark Office*